United States Patent [19]
Stengel

[11] 3,980,969
[45] Sept. 14, 1976

[54] PHASE-LOCKING LOOP WITH VARIABLE BANDWIDTH FILTER

[75] Inventor: Renato Stengel, Milan, Italy

[73] Assignee: CSELT - Centro Studi e Laboratori Telecommunicazioni SpA, Torino, Italy

[22] Filed: Apr. 14, 1975

[21] Appl. No.: 567,529

[30] Foreign Application Priority Data
Apr. 12, 1974 Italy .................................. 68173/74

[52] U.S. Cl. .................................. 331/17; 331/25; 333/70 CR
[51] Int. Cl.² ..................................... H03B 3/04
[58] Field of Search .................... 331/17, 18, 25; 333/70 CR

[56] References Cited
UNITED STATES PATENTS

| | | |
|---|---|---|
| 3,316,497 | 4/1967 | Brooks .................................. 331/17 |
| 3,805,183 | 4/1974 | Lance .................................. 331/17 X |

*Primary Examiner*—Siegfried Grimm
*Attorney, Agent, or Firm*—Karl F. Ross; Herbert Dubno

[57] ABSTRACT

A phase-locking network at the receiving end of a transmission channel carries an incoming wave of predetermined frequency matching the operating frequency of a local oscillator the incoming wave and the locally generated oscillations being fed to respective inputs of a phase comparator producing a control voltage delivered through a low-pass filter to the oscillator for reducing any existing phase difference. The signal path between the phase comparator and the oscillator includes one or more nonlinear impedance elements, either within the filter or in cascade therewith, which lowers the effective series resistance of the path in the presence of a high control voltage and thereby increases its bandwidth during an acquisition period as compared with steady-state operation.

2 Claims, 9 Drawing Figures

PHASE-LOCKING LOOP WITH VARIABLE BANDWIDTH FILTER

FIELD OF THE INVENTION

My present invention relates to a phase-locking network for a signal-transmission system wherein a local oscillator at the receiving end of a signaling channel is locked in step with an incoming oscillation of predetermined frequency.

BACKGROUND OF THE INVENTION

Networks of this description conventionally include a phase comparator with a first input receiving the incoming wave and with a second input receiving the locally generated oscillation, the output of this comparator controlling the local oscillator in a sense tending to reduce any phase difference existing between the two oscillations of substantially identical frequency fed to the comparator.

In steady-state operation, the output frequency of the local oscillator should faithfully follow any frequency drifts of the incoming wave but should not reflect any transient disturbances due, for example, to thermal noise or interfering signals. It is therefore desirable to insert a narrow-band low-pass filter between the comparator output and a control input of the oscillator so as to suppress high-frequency components of the control voltage. On the other hand, the presence of such a filter lengthens the acquisition period, i.e., the time required for establishment of the phase lock at the beginning of operations or upon temporary loss of signal.

A known and fairly obvious solution to the problem is a compromise on the bandwidth of the interposed filter to allow a reasonably fast acquisition at the expense of a certain irregularity in the local oscillation. Such a solution, of course, is not entirely satisfactory.

Another possible solution is a wobbling of the oscillator frequency to speed acquisition with a narrow-band filter. The presence of the wobbling signal, however, introduces complications since that signal must be cut off during steady-state operation and must be turned on again upon a temporary fading of the incoming wave. Similar complications are also involved with the use of a filter switchable between larger and smaller bandwidths.

OBJECTS OF THE INVENTION

The object of my present invention, therefore, is to provide means in such a network for automatically adapting the effective bandwidth of a signal path between the comparator output and the oscillator input to the currently existing operating conditions, i.e., for progressively reducing the bandwidth during the approach of the steady state.

SUMMARY OF THE INVENTION

This object is realized, in accordance with my present invention, by the provision of circuit means including the aforementioned low-pass filter, connected in the signal path between the output of the phase comparator and the control input of the local oscillator, comprising nonlinear impedance means monotonically varying in magnitude with increasing values of the control voltage issuing from the phase comparator.

As more fully discussed hereinafter, the impedance/voltage characteristic of the nonlinear impedance means should be capable of lowering the effective series resistance of the signal path in the presence of higher values of the control voltage. If the low-pass filter is of the active type including an operational amplifier provided with a capacitive feedback circuit, such an impedance/voltage characteristic can be realized by means of a resistive component in series with that amplifier and/or with the aid of a resistive or capacitive component in the feedback path. In the first instance, the component should have a falling resistance/voltage characteristic; in the second instance the impedance (resistance or capacitance) of that component should increase with rising voltage.

BRIEF DESCRIPTION OF THE DRAWING

The above and other features of my invention will now be described in detail with reference to the accompanying drawing in which.

SPECIFIC DESCRIPTION

Figure 1:
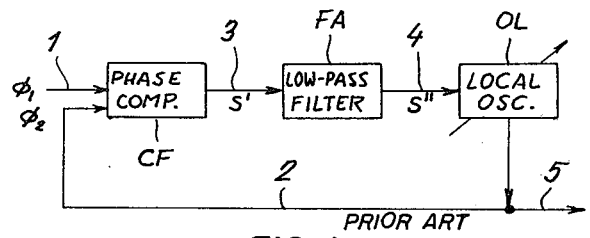
FIG. 1 is a block diagram of a basically conventional phase-locking network to which the present improvement is applicable.

In FIG. 1 I have shown the receiving end 1 of a transmission channel carrying an incoming wave of phase $\Phi_i$, fed to one input of a phase comparator CF, an adjustable local oscillator OL whose output signal — of a frequency substantially matching that of the incoming wave and of a phase $\Phi_o$ — is fed back via a loop 2 to another input of comparator CF, and a low-pass filter FA inserted between an output lead 3 of comparator CF and a control lead 4 of oscillator OL. An extension 5 of loop 2 leads to a nonillustrated load.

A voltage $S'$ in the output of comparator CF varies, according to a proportionality factor $K_d$, with the phase difference $\Phi_i - \Phi_o$; a corresponding control voltage $S''$ on lead 4 is related to the pulsatance $\omega$ of the oscillation on leads 2 and 5 by a proportionality factor $K_o$ which may be defined by $$K_o = [\frac{d\omega}{dS''}]_{\omega = \omega_o} \qquad (1)$$

where $\omega_o$ is the pulsatance or angular frequency during steady-state operation of oscillator OL.

The relationship between voltages $S'$ and $S''$ is determined by a transfer function of filter FA.

Figure 2:
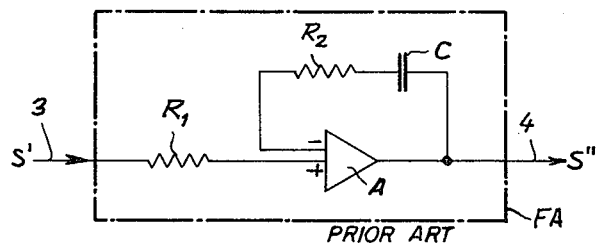
FIG. 2 is a circuit diagram of an active filter forming part of the network of FIG. 1.

As shown in FIG. 2, the filter here envisaged comprises an operational amplifier A with a series input resistor $R_1$ and a feedback circuit including another resistor $R_2$ in series with a capacitor C. The theory of the operation of such an active filter is described, for example, in the book "Phaselock Technique" by F. M. Gardner, published 1966 by John Wiley & Sons of New York City.

From the known properties of filter FA, as described in the above-identified reference book, it can be shown that the effective bandwidth B of the signal path 3, FA, 4 is given by $$B = \omega_n \,[2\zeta^2 + 1 + \sqrt{(2\zeta^2 + 1)^2 + 1}\,]^{1/2} \ldots \quad (2)$$

where $\omega_n$ is the natural pulsatance of the signal path which, in simplified form, may be expressed by $$\omega_n = (K_o K_d/\tau_1)^{1/2} \ldots \quad (3)$$

and where $\zeta$ the damping factor, is given by $$\zeta = \frac{\tau_2}{2} \left( \frac{K_o K_d}{\tau_1} \right)^{1/2} \quad (4)$$

In equations (3) and (4), parameters $\tau_1$ and $\tau_2$ are two time constants determined by the resistances $R_1$ and $R_2$ and the capacitance C of the filter circuit of FIG. 2, i.e.

$$\tau_1 = R_1 \cdot C \ldots \quad (5)$$

and $$\tau_2 = R_2 \cdot C \ldots \quad (6).$$

It will thus be apparent that the bandwidth B varies with $\tau_2$ and inversely with $\tau_1$ (with $\tau_2$ predominating); thus, if any of the above-identified parameters $\tau_2$, $\tau_2$, $K_o$, $K_d$ varies nonlinearly with voltage, a corresponding variation in bandwidth can be automatically realized.

Figure 3:
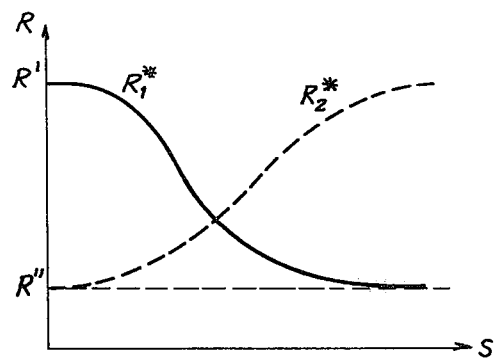
FIG. 3 is a graph showing the resistance/voltage characteristics of two types of nonlinear components adapted to be used, according to my invention, in the basic network of FIG. 1.
Figure 8:
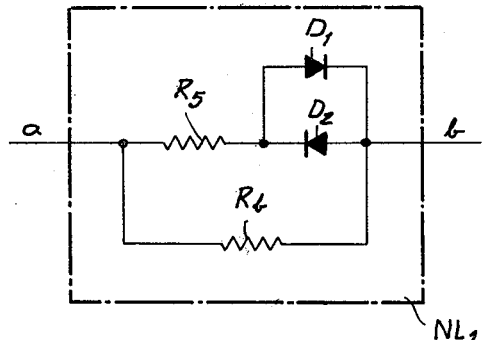
FIG. 8 is a circuit diagram of a nonlinear network component used in the system of FIG. 4.
Figure 4:
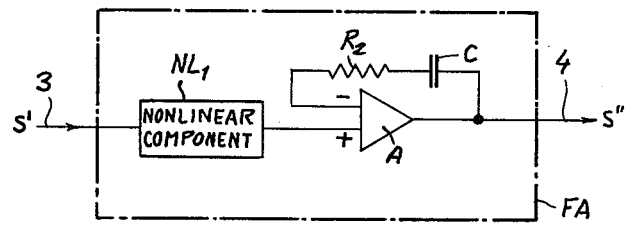
FIGS. 4 – 6 are circuit diagrams similar to FIG. 2, showing modifications of the active filter in accordance with the present improvement.

In FIG. 3 I have indicated by a curve $R_1^*$ a desired resistance/voltage characteristic for a nonlinear circuit component $NL_1$, FIG. 4, to be substituted for the series resistor $R_1$ of FIG. 2. That characteristic varies monotonically with a negative slope starting at a value R' and approaching asymptotically a lower resistance limit R''. Component $NL_1$, as shown in FIG. 8, may comprise two parallel resistive branches $R_5$ and $R_6$, resistor $R_5$ being in series with a pair of antiparallel diodes $D_1$ and $D_2$. As long as the voltage difference between the input a and the output b of this component is small, the diode pair $D_1$, $D_2$ has a relatively high resistance supplementing that of resistor $R_5$, the combined resistance of this branch substantially exceeding that of resistor $R_6$ whose magnitude therefore essentially determines the starting point R' of curve $R_1^*$ in FIG. 3. With larger applied voltages the forwardly polarized diode becomes more highly conductive, causing the overall resistance to drop toward the value R''.

Figure 7:
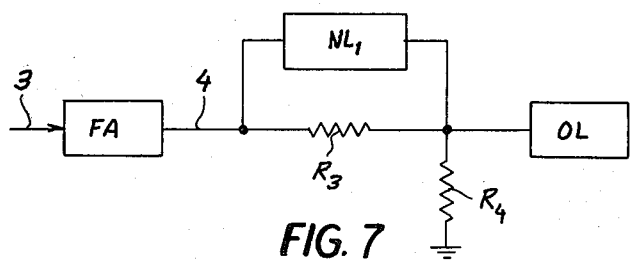
FIG. 7 is a circuit diagram showing another arrangement according to my invention.

In FIG. 7 I have shown the same type of component $NL_1$ inserted in the output lead 4 of filter FA, in parallel with a resistor $R_3$ constituting a voltage divider with another resistor $R_4$ connected to ground. The nonlinearity of component $NL_1$ affects the magnitude of the control voltage applied to oscillator OL and may therefore be regarded as a property of coefficient $K_o$.

While the nonlinear component $NL_1$ in FIG. 4 has been considered as part of the filter FA, it could also be regarded as a circuit element in series therewith, connected to the output of comparator CF to control the magnitude of the voltage S' on lead 3. In that case the nonlinearly varying parameter would be the coefficient $K_d$ rather than the time constant $\tau_1$. Naturally, an additional resistor $R_1$ (FIG. 2) could then be inserted between component $NL_1$ and amplifier A; component $NL_1$ could also be supplemented by further resistors $R_3$ and $R_4$ as in FIG. 7.

Figure 9:
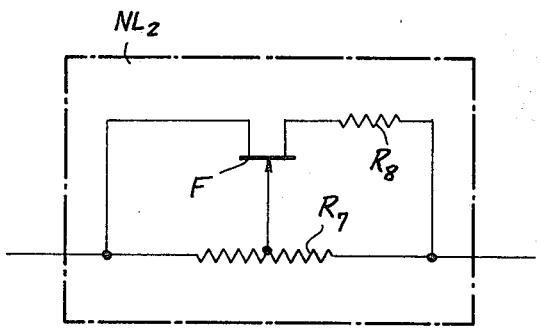
FIG. 9 is a circuit diagram of a nonlinear network component used in the system of FIG. 5.
Figure 5:
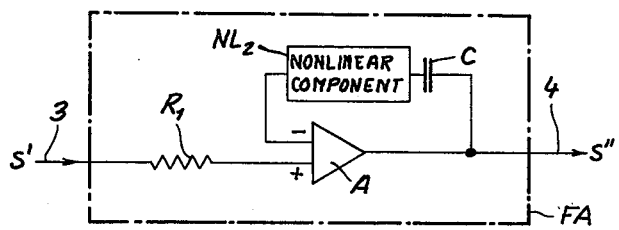

FIG. 5 shows a nonlinear component $NL_2$ taking the place of resistor $R_2$ in FIG. 2, this component having a characteristic $R_2^*$ as indicated in FIG. 3. A component of this description may be a network with two parallel resistive branches having the configuration shown in FIG. 9, including a resistor $R_7$ shunted by a resistor $R_8$ in series with a field-effect transistor F whose gate is tied to a tap on resistor $R_7$. The conductivity of transistor F decreases with an increasing voltage drop across resistor $R_7$.

Figure 6:
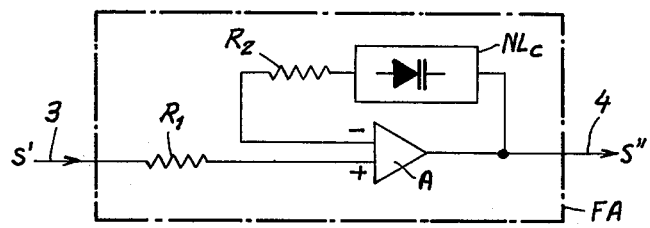

In FIG. 6, finally, a reactive component $NL_c$ including a nonlinear capacitance (varactor) has been substituted for the capacitor C of FIG. 2. Since the bandwidth B increases with capacitance C according to the foregoing equations, the capacitance/voltage characteristic of component $NL_c$ should be generally similar to curve $R_2^*$ in FIG. 3.

Naturally, the nonlinear components shown in FIGS. 4 – 7 could also be employed jointly in various combinations.

I claim:

1. In a signaling system including a transmission channel carrying an incoming wave of predetermined frequency, a phase comparator provided with a first and a second input, said first input being connected to said channel for receiving said incoming wave therefrom, an adjustable local oscillator delivering to said second input a matching oscillation of substantially the same frequency as said incoming wave, and circuit means including a low-pass filter connected in a signal path between an output of said phase comparator and a control input of said oscillator for applying to the latter a control voltage varying with a phase difference between said incoming wave and said matching oscillation to modify the frequency of said matching oscillation in a sense tending to reduce said phase difference, said filter comprising an operational amplifier provided with a capacitive feedback circuit, the improvement wherein said circuit means includes nonlinear impedance means in said feedback circuit rising in magnitude with increasing values of said control voltage for enlarging the effective bandwidth of said circuit means during an acquisition period in comparison with steady-state operation by lowering the effective series resistance of said signal path in the presence of higher values of said control voltage.

2. The improvement defined in claim 1 wherein said impedance means comprises a network with two parallel resistive branches, one of said branches including a field-effect transistor with a gate connected to an intermediate point of the other of said branches.

* * * * *